US008594346B2

(12) United States Patent
Kwan et al.

(10) Patent No.: US 8,594,346 B2
(45) Date of Patent: Nov. 26, 2013

(54) AUDIO OUTPUT DRIVERS FOR PIEZO SPEAKERS

(75) Inventors: Dennis Kwan, San Diego, CA (US); Suresh Singamsetty, Aliso Viejo, CA (US); Jeffrey Hsieh, Dove Canyon, CA (US)

(73) Assignee: SilverPlus, Inc., Irvine, CA (US)

( * ) Notice: Subject to any disclaimer, the term of this patent is extended or adjusted under 35 U.S.C. 154(b) by 237 days.

(21) Appl. No.: 13/134,648

(22) Filed: Jun. 13, 2011

(65) Prior Publication Data

US 2011/0305356 A1 Dec. 15, 2011

Related U.S. Application Data

(60) Provisional application No. 61/397,664, filed on Jun. 15, 2010.

(51) Int. Cl.
*H04R 3/00* (2006.01)
*H03F 3/38* (2006.01)

(52) U.S. Cl.
USPC .......... 381/114; 330/10

(58) Field of Classification Search
USPC .......... 381/111, 190, 120, 121, 114; 320/141; 340/384.6, 384.7; 330/10, 251
See application file for complete search history.

(56) References Cited

U.S. PATENT DOCUMENTS

| | | | | |
|---|---|---|---|---|
| 4,109,174 | A | 8/1978 | Hodgson | |
| 4,498,089 | A | 2/1985 | Scardovi | |
| 4,947,074 | A | 8/1990 | Suzuki | |
| 5,126,589 | A | 6/1992 | Renger | |
| 5,262,757 | A | 11/1993 | Hansen | |
| 6,016,040 | A | 1/2000 | Hoffmann et al. | |
| 6,016,075 | A * | 1/2000 | Hamo | 330/10 |
| 6,184,812 | B1 | 2/2001 | Younis et al. | |
| 6,617,967 | B2 | 9/2003 | Baldwin et al. | |
| 7,070,577 | B1 | 7/2006 | Haller et al. | |
| 7,161,263 | B2 | 1/2007 | von Styp-Rekowski et al. | |
| 2005/0219040 | A1 * | 10/2005 | Dryer | 340/384.71 |
| 2007/0036375 | A1 * | 2/2007 | Jensen | 381/312 |
| 2008/0056507 | A1 | 3/2008 | Logvinov et al. | |
| 2009/0230924 | A1 * | 9/2009 | Wright | 320/148 |

FOREIGN PATENT DOCUMENTS

WO PCT/US2011/001074 9/2011

* cited by examiner

*Primary Examiner* — Fan Tsang
*Assistant Examiner* — Eugene Zhao
(74) *Attorney, Agent, or Firm* — Saile Ackerman LLC; Stephen B. Ackerman

(57) ABSTRACT

A driver circuit for a piezoelectric speaker is described, wherein charge is transferred from a charge reservoir to the speaker. In a first embodiment a delta sigma circuit uses a pulse width modulated digital audio signal to control a push-pull circuit to drive the piezoelectric speaker. High frequency harmonics are introduced to the delta sigma drive signals to enhance the low frequency response of the speaker. A charge recovery mechanism recovers charge from the speaker to reduce the frequency of replenishing the charge reservoir and to provide additional drive current for the speaker. In a second embodiment the pulse width modulated signal is used to drive a voltage quadrupling circuit that drives the piezoelectric speaker, wherein the reservoir capacitor is integrated with the capacitors of quadrupling circuit, which provides charge recovery.

18 Claims, 2 Drawing Sheets

AUDIO OUTPUT DRIVERS FOR PIEZO SPEAKERS

This application claims priority to Provisional Patent Application Ser. No. 61/397,664, filed on Jun. 15, 2010, which is herein incorporated by reference in its entirety.

BACKGROUND OF THE INVENTION

1. Field of Invention

This invention is related to driver circuits and in particular audio output drivers for piezoelectric speakers.

2. Description of Related Art

A large part of the power consumption of an audio device is the output stages or power of the power amplifier section. It is particularly critical for portable devices powered by batteries to conserve power to reduce battery drain. Most audio devices use traditional electro-magnetic speakers, which present an electrical resistance and consume power as a result of the resistance, wherein only a small portion of the output energy is converted to an audio signal. The inefficiency of converting electrical energy to sound using electro-magnetic speakers is a reality with all audio devices regardless of the efficiency of the power amplifier section.

Another type of audio speaker uses piezoelectric technology that in general provides a capacitive load. Piezoelectric sound devices are not new; however, applications of piezoelectric sound producing devices in general have been limited to simple sounding devices, for instance alarms, tones and simple sounds, but not in general audio signals such as voice.

US 2002/0126001 A1 (Baldwin et al.) is directed to a piezoelectric transducer driving circuit that has a main oscillator stage, a buffer circuit and a voltage doubling circuit. U.S. Pat. No. 7,161,263 B2 (von Styp-Rekowski et al.) is directed to a piezoelectric driving and switching apparatus, which includes a power supply circuit having a supply open configuration and positive and negative configurations for transferring to an inductor. U.S. Pat. No. 7,070,577 B1 (Haller et al.) is directed to an implantable beneficial agent infusion device featuring a unique energy recovery circuit and a deflectable energy storing member. U.S. Pat. No. 6,016,040 (Hoffmann et al.) is directed to a device for driving capacitive actuator, which contains a charge capacitor and a discharge capacitor. In U.S. Pat. No. 5,262,757 (Hansen) an electronic warning device, which includes a power source, is directed to a motion detector, a pleasant tone generator, a loud tone generator and a remote activation switch. In U.S. Pat. No. 5,126,589 (Renger) a piezoelectric drive circuit is directed to use with a capacitive load including two transistors controlled by a drive voltage that is connected to the load by an inductor. U.S. Pat. No. 4,947,074 (Suzuki) is directed to a piezoelectric device drive circuit that comprises a charge circuit and a switch circuit connected between the terminals of the piezoelectric device. In U.S. Pat. No. 4,498,089 (Scardovi) a control circuit is directed to an ink jet printing element, wherein individual drops of ink are expelled from a container by way of the contractions piezoelectric transducer. In U.S. Pat. No. 4,109,174 (Hodgson) a drive circuit is directed to a piezoelectric device, which comprises and inductor wherein energy from the inductor is transferred to the piezoelectric device.

Because of the capacitive nature of piezoelectric sound devices, a speaker for instance, energy is stored as a voltage across the terminals of the device as current flows into the sound device. This energy is lost when the driver circuit reverses the polarity of the output signal of the driver circuit, and the piezoelectric speaker, or sound device, is discharged. If this lost charge could be recovered, then the power consumption of the driver circuit could be reduced with only a small reduction in audio volume since the sound device, or speaker, will vibrate in the same way whether the charge is lost in discharge or recovered in some manner.

SUMMARY OF THE INVENTION

It is an objective of the present invention to recover energy from a piezoelectric speaker to reduce the power requirements to drive the speaker.

It is further an objective of the present invention to use a noise shaping function to generate an audio signal having high frequency harmonics of the components of the audio signal.

It is also further an objective of the present invention to use two inverter gates as an audio driver using pulse width modulation (PWM) with or without noise shaping modulated digital audio signals as input.

It is still further an objective of the present invention to use PWM with or without noise shaping modulated digital audio signals as a control for a switched capacitor voltage doubling circuit and use a piezoelectric speaker as a reservoir capacitor for a charge pump doubler.

It is also an objective of the present invention to use an unregulated charge pump regulator to generate a high voltage required by a piezoelectric speaker.

In the present invention when energy is recovered from a piezoelectric speaker, then the power consumption needed to drive the speaker is greatly reduced with little to no reduction in audio volume since the speaker will vibrate in the same way whether the energy is lost or recovered. The present invention demonstrates a general method to recover energy from a piezoelectric device (speaker) and includes two practical implementations.

The conversion of electrical power to an audio signal for a typical piezoelectric speaker is a nonlinear function. In particular, lower frequencies are not well converted to sound from the speaker, for instance the frequency response of piezoelectric speakers drops off significantly below 1 KHz. The low frequency response can be improved by increasing the high frequency harmonics of the signal driving the piezoelectric speaker. A first embodiment of the present invention applies a high frequency noise shaping function, for example delta sigma modulation, to cause high frequency signal components to excite the piezoelectric speaker without causing significant loss in audio quality, which results in increasing the high frequency harmonics. In a second embodiment of the present invention non-linear functions, for example square-law devices, hard limiting or clipping, are applied to an audio signal to introduce high frequency harmonics to which a piezoelectric speaker is more responsive A use of a charge pump to drive a piezoelectric speaker results in high efficiency since the circuit topology is essentially lossless compared to linear amplifiers, for instance amplifier classes A, AB and C, which are inefficient because of the driver circuits. The use of a charge pump to drive a piezoelectric speaker is similar to class D and E amplifiers, but more efficient because of the integration of the driver circuit with the voltage multiplier circuit.

The net result in applying some or all of the techniques noted herein is to achieve a reduction in energy necessary to drive the piezoelectric speaker. The overall benefit can be eight to ten times reduction in current consumption while achieving the same audio volume. There is also a potential cost benefit because circuits are simpler and have less hardware. The use of unregulated voltage doubler to power driver circuit functions can limit current, so that for battery-powered devices, the peak current that is available is not exceeded at a high signal level, which is a cause for battery voltage to drop too low.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
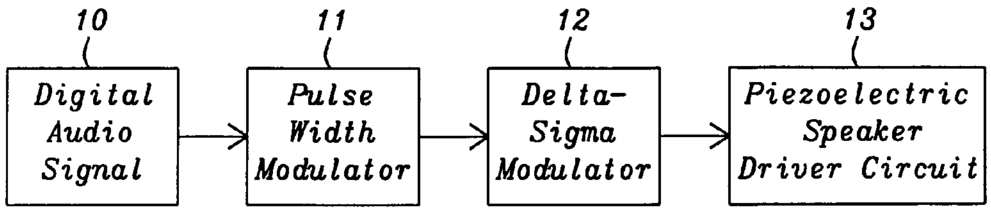
FIG. 1 is a block diagram of the present invention of the steps to modulate a digital audio signal.

In FIG. 1 is a block diagram of the present invention where a digital audio signal 10 is fed first through a pulse width modulator 11 and then fed through a delta sigma modulator 12 to provide a signal to drive a piezoelectric speaker driver circuit. 13. Low frequency response of the piezoelectric speaker is enhanced by an increase in high frequency harmonic content of the signal applied to the piezoelectric speaker. A high frequency noise shaping function of the delta sigma modulation, for instance, introduces high frequency signal components to excite the piezoelectric speaker without causing a significant loss in audio quality. Also nonlinear functions such as square law, hard limiting or clipping devices that are applied to the audio signal introduce high frequency harmonics to which the piezoelectric speaker responds favorably, and for the same audio output the input can be reduced to save power consumption.

Figure 2:
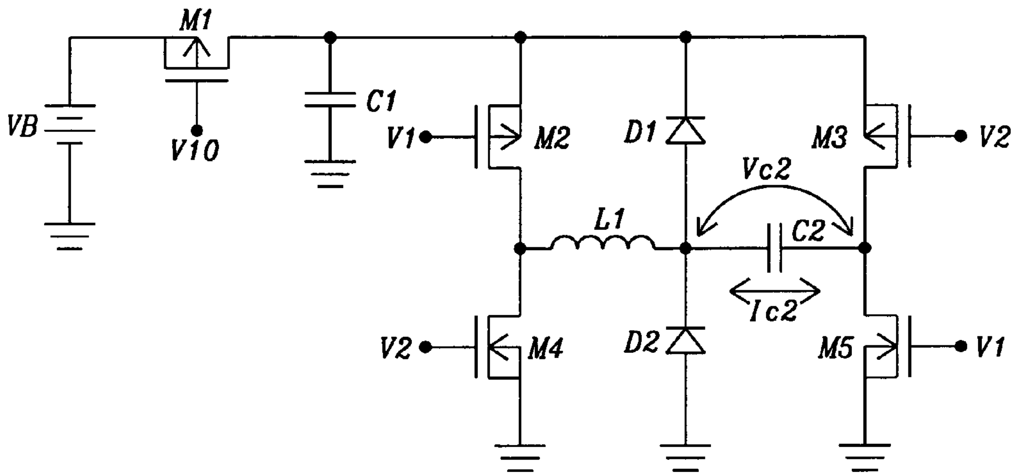
FIG. 2 is a circuit diagram of a driver circuit for a piezoelectric speaker of the first embodiment of the present invention.

FIG. 2 is a circuit diagram of the first embodiment of present invention of a driver circuit for a piezoelectric speaker. The capacitor C1 represents a storage, or reservoir, capacitor and the capacitor C2 represents a piezoelectric speaker. Typically for example, the value of capacitance for the storage capacitor C1 is approximately 10 uF and the value of capacitance for the piezoelectric speaker is approximately 1 uF. The inductor L1, approximately 220 uH, coupled with the capacitance C2 of the speaker provides an impedance of approximately 1.4 k ohms. The transistor M1 provides a means by which the voltage source VB is connected to the speaker driver circuit. Transistors M2, M3, M4 and M5 provide a push-pull driver, which are driven by anti-phase related signals, that energizes the speaker C1 by stimulus applied to the gates of transistors M2, M3, M4 and M5 from the audio signal 10 through the delta sigma modulator 12. The diodes, D1 and D2, allow a charge on the speaker C2 to be discharged back to the reservoir capacitor C1 for any abnormally high voltage spikes, for example if the transistors are all turned off when current is flowing through the inductor. Otherwise the diodes do not play any part during normal operation of the circuit.

When the storage capacitor is charged, transistors M1 is off, M2 and M5 are turned on by a signal v1 from the delta sigma modulator to allow charge transfer from the storage capacitor C1 to the piezoelectric speaker represented by C2. Then transistors M3 and M4 are controlled on by the delta sigma modulator by an inverted signal v2 that reverses the voltage applied to the piezoelectric speaker represented by C2. The delta sigma modulator signals v1 and v2 are switched at a frequency much higher than the time constant of the LC circuit formed by L1 and C2, and the direction of current flow is a function of the time constant of the LC circuit and the long-term average voltages of v1 and v2.

The purpose of transistor M1 is to maintain the charge on the reservoir capacitor C1 by momentarily supplying a constant voltage VB across capacitor C1. Transistor M1 is infrequently turned on compared to the switching frequency of v1 and v2, for example once every 10,000 cycles of v1 or v2. Transistor M1 is only turned on to replenish C1 when transistors M2, M3, M4, and M5 are momentarily turned off to allow the charging of C1 from the supply voltage VB.

Figure 3A:
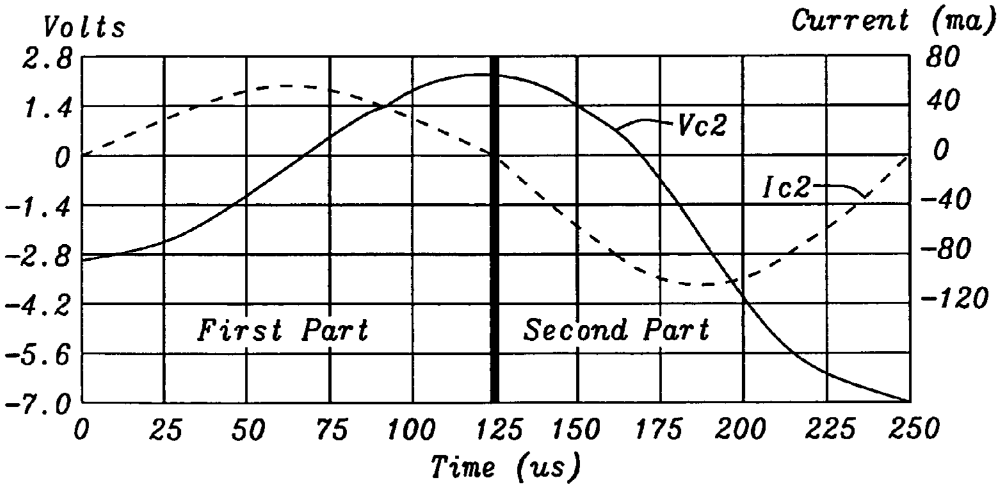
FIG. 3A is a simulation of the present invention for the voltage across the piezoelectric speaker and the current through the piezoelectric speaker.
Figure 3B:
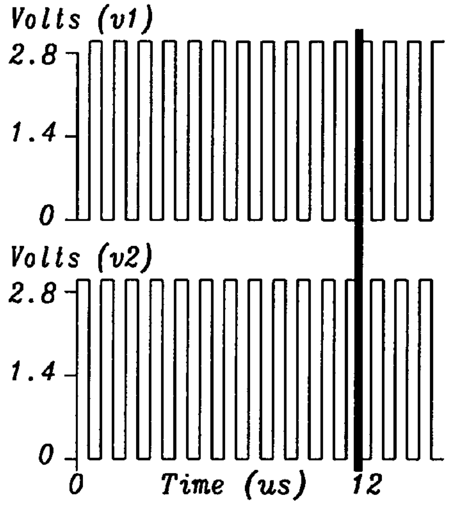
FIG. 3B shows the delta sigma modulator signals for the first part of the simulation.
Figure 3C:
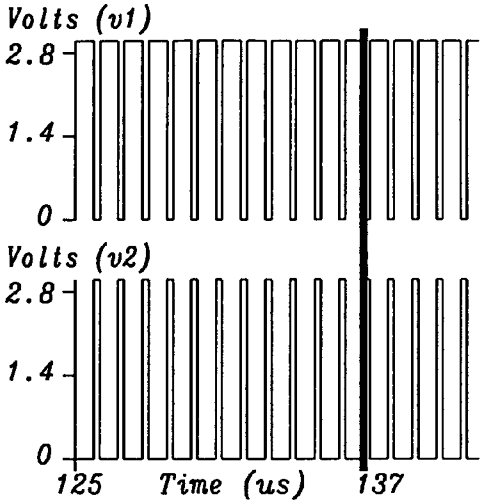
FIG. 3C shows the delta sigma modulator signals for the second part of the simulation.

In FIG. 3A is shown a simulation of the voltage Vc2 across the piezoelectric speaker represented by C2, and the current Ic2 that flows into the piezoelectric speaker C2. The simulation is divided into two parts, 0-125 microseconds and 125-250 microseconds. In the first part of the simulation the voltage Vc2 across C2 varies from a negative voltage to a positive voltage while the current Ic2 into C2 varies from 0 ma to a peak positive value and back to 0 ma, where signals v1 and v2 from the delta sigma modulator 12 are in opposite phase for a particular duty cycle, as shown in FIG. 3B. In the second part of the simulation the voltage Vc2 varies from a positive voltage to −7V while the current Ic2 into the capacitance C2 of the piezoelectric speaker is negative, varying from 0 ma to a negative value and back to 0 ma, where the signals v1 and v2 from the delta sigma modulator 12 are in opposite phase for a different duty cycle compared to the first part of the simulation, as shown in FIG. 3C. It should be noted that the implied frequency of the signals v1 and v2 in part 1 and part 2 is exemplary for the purposes of demonstrating the operation of the first embodiment of the present invention.

Figure 4:
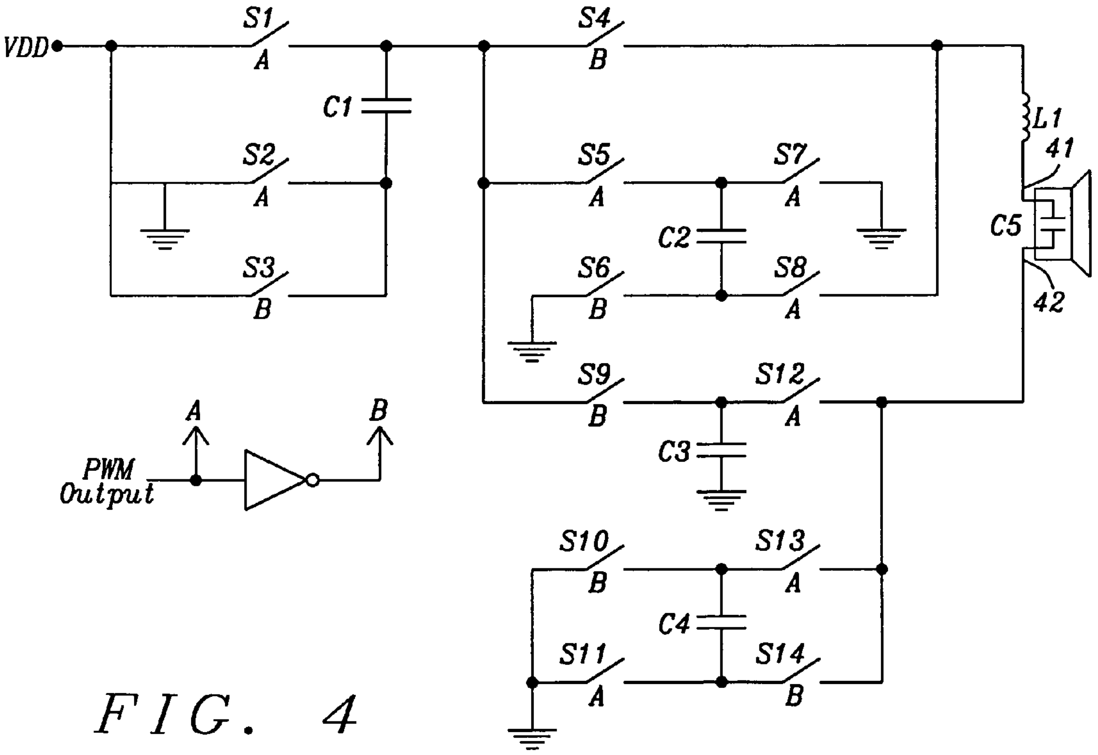
FIG. 4 is a circuit diagram of the present invention for a piezoelectric speaker driver circuit with an integrated voltage quadruple circuit of the second embodiment of the present invention.

In FIG. 4 is shown a driver circuit for a piezoelectric speaker of the second embodiment of the present invention. In the circuit of FIG. 4 the audio signal of the pulse width modulator 11 is used to toggle various switches without the use of a separate high frequency clock, which introduces noise to audio circuits. In the second embodiment a voltage quadrupling circuit is used to drive the piezoelectric speaker represented by C5. Two capacitive pairs are used as reservoir capacitors. The first pair is capacitors C2 and C3 and the second pair is capacitors C1 and C4. Two signals A and B are created from the output of the pulse width modulator (PWM). The two signals A and B are used to drive switches (preferably semiconductor transistors) that result in the quadrupling of the voltage applied to the piezoelectric speaker C5. The capacitors required to produce a voltage doubling circuit and a voltage quadrupling circuit are combined with the reservoir capacitor of the audio circuit.

Signal A is used to drive switches S1, S2, S7, S8, S11, S12 and S13, and signal B is used to drive switches S3, S4, S5, S6, S9, S10 and S14. When the switches driven by the PWM signal A are closed, the capacitor C1 is charged to VDD and capacitor C4 is charged to twice VDD, wherein the charge on C3 is used to provide the added charge to capacitor C4 and doubling the voltage on C4, or twice VDD. When the switches driven by the PWM signal B are closed, capacitors C2 and C3 are charged to VDD plus the voltage across C1. This results in the charge across capacitor being twice VDD.

Looking at the voltages applied to the terminals 41 and 42 of the speaker C5 when the switches controlled by signal A are closed, the terminal 41 connected to the inductor L1 will be at twice the negative value of VDD and capacitor C4 supplies twice the value of VDD to terminal 42 of the speaker C5. When the switches control by signal B of the PWM 11 are closed, capacitor C1 connects twice the value of VDD to speaker terminal 41 and capacitor C4 connects twice the value of VDD to speaker terminal 42. Thus the speaker C5 is driven by four times the Value of VDD.

The circuit of FIG. 4 provides three advantages. The first advantage is that using the PWM signals to toggle the required circuit switches negates the need for a high frequency clock, which can introduce noise into the audio signals. The second advantage is the voltage doubling circuit of FIG. 4 integrates together the reservoir capacitors and the capacitors required to double the PWM output signals and provides capability for charge recovery and energy efficiency. The third advantage is that by combining both the voltage doubling circuitry and the audio driver circuitry, the efficiency is increased by reducing losses due to inefficiencies in a conventional voltage doubling circuit such as a charge pump and in the resistive losses incurred during the transfer of energy from the voltage doubling circuit to the audio driver.

While the invention has been particularly shown and described with reference to preferred embodiments thereof, it will be understood by those skilled in the art that various changes in form and details may be made without departing from the spirit and scope of the invention.

What is claimed is:

1. A piezoelectric speaker circuit, comprising:

a) a delta sigma modulator driven by an audio signal through a pulse width modulator (PWM);
b) a reservoir capacitor charged to a source voltage;
c) a piezoelectric speaker;
d) a push-pull driver circuit;
e) a charge recovery diode; and
f) said delta sigma modulator controls the push-pull circuit with digital signals to cause the piezoelectric speaker to respond to the audio signal, wherein low frequency response of the piezoelectric speaker is improved by high frequency harmonics of the signal of the delta sigma modulator, wherein the reservoir capacitor provides charge used by the push-pull driver circuit to drive the piezoelectric speaker, and wherein said charge recovery diode recovers charge back to the reservoir capacitor from the piezoelectric speaker.

2. The circuit of claim 1, wherein said reservoir capacitor is at least ten times larger in value than the capacitance of the piezoelectric speaker.

3. The circuit of claim 1, wherein said reservoir capacitor is maintained at a specified charge by periodically coupling the reservoir capacitor to a fixed voltage source.

4. The circuit of claim 1, wherein said delta sigma modulator produces at least two phase related signals to control the current through and the voltage across the piezoelectric speaker.

5. The circuit of claim 4, wherein said delta sigma modulator produces more than two phase related signals to control the push-pull circuit to eliminate the need of the charge recovery diode by adjusting at least one of the phase related signals to provide charge recovery time.

6. The circuit of claim 1, wherein the digital signals are shaped to increase a high frequency harmonic content of signals applied to the piezoelectric speaker excite the speaker and improve low frequency response of the speaker.

7. The circuit of claim 1, wherein said pulse width modulator (PWM) is used to drive a circuit that quadruples the audio signal output of the PWM coupled to the piezoelectric speaker, wherein a positive charge doubling PWM audio signal is connected to a first of two input terminals of the speaker and a negative doubling PWM audio signal is connected to a second of two input terminals of the speaker.

8. The circuit of claim 7, wherein said PWM audio signal toggles switches in an audio circuit to produce a doubled signal without the use of a separate high frequency clock in which high frequency clock induces noise to the audio circuit.

9. The circuit of claim 7, wherein said reservoir capacitor is combined with capacitors of the charge doubling circuit that allows charge recovery from the piezoelectric speaker.

10. A method for driving a piezoelectric speaker, comprising:

a) modulating a digital audio signal with a pulse width modulator (PWM);
b) creating a delta sigma signal comprising the pulse width modulated audio signal to drive a piezoelectric speaker, wherein the high frequency harmonics of the sigma delta signal improves the low frequency response of the piezoelectric speaker;
c) driving the piezoelectric speaker from a reservoir charge source to charge the capacitance of the piezoelectric speaker; then
d) discharging the charge of the piezoelectric speaker into the reservoir charge source with a charge recovery diode to conserve charge of the charge source, wherein current from the discharge drives the piezoelectric speaker.

11. The method of claim 10, wherein driving the piezoelectric speaker comprises the use of a push pull driver circuit.

12. The method of claim 10, wherein said delta sigma modulation applied to the pulse width modulation of the digital audio signal creates a high frequency noise shaping function that enhances a low frequency response of the piezoelectric speaker.

13. The method of claim 12, wherein said high frequency noise shaping function introduces high frequency signal components to excite the piezoelectric speaker without causing a significant loss in audio quality.

14. The method of claim 10, wherein said capacitance of the piezoelectric speaker is combined with an inductor to form a bandpass that is designed to provide a tradeoff between audio volume, audio quality and power consumption.

15. The method of claim 14, wherein said capacitance of piezoelectric speaker and the inductor form an impedance of approximately about 1.4K ohms at a sigma delta modulator frequency and presents a load that draws approximately about 2 ma of average current from an approximate 3V PWM signal.

16. The method of claim 10, wherein said pulse width modulated signal is quadrupled to drive the piezoelectric speaker where a positive doubled PWM signal is applied to a first of two piezoelectric speaker terminals and a negative doubled PWM signal is applied to a second of two piezoelectric speaker terminals.

17. The method of claim 16, wherein said PWM signal controls switches to double the PWM signal without the use of a separate high frequency clock that produces noise in the audio circuit.

18. The method of claim 16, wherein said reservoir charge source is combined with charge doubling capacitors that allows charge recovery from the piezoelectric speaker.

* * * * *